United States Patent
Deus

(10) Patent No.: US 11,133,154 B2
(45) Date of Patent: Sep. 28, 2021

(54) ELECTRON BEAM VAPORIZER AND METHOD FOR VAPORIZING A VAPORIZATION MATERIAL BY MEANS OF AN ELECTRON BEAM

(71) Applicant: VON ARDENNE Asset GmbH & Co. KG, Dresden (DE)

(72) Inventor: Carsten Deus, Dresden (DE)

(73) Assignee: VON ARDENNE Asset GmbH & Co. KG, Dresden (DE)

(*) Notice: Subject to any disclaimer, the term of this patent is extended or adjusted under 35 U.S.C. 154(b) by 147 days.

(21) Appl. No.: 16/379,807

(22) Filed: Apr. 10, 2019

(65) Prior Publication Data
US 2019/0318909 A1    Oct. 17, 2019

(30) Foreign Application Priority Data
Apr. 12, 2018  (DE) .................. 10 2018 108 726.8

(51) Int. Cl.
| C23C 14/30 | (2006.01) |
| C23C 14/54 | (2006.01) |
| H01J 37/305 | (2006.01) |
| H01J 37/147 | (2006.01) |

(52) U.S. Cl.
CPC .......... *H01J 37/3053* (2013.01); *C23C 14/30* (2013.01); *C23C 14/54* (2013.01); *H01J 37/1475* (2013.01); *H01J 2237/1526* (2013.01); *H01J 2237/3132* (2013.01)

(58) Field of Classification Search
CPC ............................... C23C 14/30; C23C 14/54
See application file for complete search history.

(56) References Cited

U.S. PATENT DOCUMENTS

| 3,869,675 A * | 3/1975 | Patz ............... H01J 37/3053 |
| | | 219/121.15 |
| 5,421,917 A * | 6/1995 | Partridge ............ C22C 1/00 |
| | | 148/403 |
| 6,589,351 B1 | 7/2003 | Bruce et al. |

(Continued)

FOREIGN PATENT DOCUMENTS

| DE | 19745771 A1 | 4/1999 |
| DE | 102007063364 | * 7/2008 |

(Continued)

OTHER PUBLICATIONS

DE102010035315, Scheffel, Mar. 2012, English machine translation (Year: 2012).*

(Continued)

*Primary Examiner* — Joseph A Miller, Jr.
(74) *Attorney, Agent, or Firm* — Viering, Jentschura & Partner mbB

(57) ABSTRACT

According to various embodiments, a method for vaporizing a vaporization material by means of an electron beam may include the following: generating a first deflection pattern having a first power density at least on an end face of a rod-shaped vaporization material; and, subsequently, generating a second deflection pattern having a second power density on a portion of an outer edge of the rod-shaped vaporization material and a portion of an inner edge of a ring crucible, which encloses the rod-shaped vaporization material, wherein the second power density is greater than the first power density.

20 Claims, 3 Drawing Sheets

(56) References Cited

U.S. PATENT DOCUMENTS

| | | | |
|---|---|---|---|
| 2001/0016237 A1 | 8/2001 | Baehr et al. | |
| 2003/0019430 A1* | 1/2003 | Malischke | C23C 14/54 118/723 EB |
| 2004/0118347 A1* | 6/2004 | Groves | H01J 37/32055 118/723 EB |
| 2014/0099450 A1* | 4/2014 | Sachs | C23C 14/5873 427/552 |

FOREIGN PATENT DOCUMENTS

| | | |
|---|---|---|
| DE | 102010035315 A1 | 3/2012 |
| DE | 102011080810 A1 | 2/2013 |
| JP | 2003034864 * | 2/2003 |

OTHER PUBLICATIONS

Wenzel, DE_102007063364_A1_I Jul. 2008 Eng abstract (Year: 2008).*
Malischke JP_2003034864_A_I Feb. 2003 Eng translation (Year: 2003).*
German Office Action based on Application No. 10 2018 108 726.8 (7 pages) dated Feb. 25, 2019 (for reference purpose only).

* cited by examiner

ELECTRON BEAM VAPORIZER AND METHOD FOR VAPORIZING A VAPORIZATION MATERIAL BY MEANS OF AN ELECTRON BEAM

CROSS CITATION

This is a non-provisional application claiming priority to German Patent Application DE 10 2018 108 726.8, filed on Apr. 12, 2018, the content of which is fully incorporated by reference.

TECHNICAL FIELD

Various exemplary embodiments relate to an electron beam vaporizer and a method for vaporizing a vaporization material by means of an electron beam.

BACKGROUND

In general, an electron beam may be provided by means of a so-called electron beam gun. In this case, the electron beam may be generated having a sufficiently high power that a target may be at least partially melted by means of the electron beam inside a vacuum process chamber. Therefore, for example, by means of the electron beam and the target, a vapor source made of vaporized material of the target may be provided for coating a substrate inside the vacuum process chamber by means of the vaporized material.

BRIEF DESCRIPTION OF THE DRAWINGS

Exemplary embodiments are illustrated in the figures and will be explained in greater detail hereafter.

In the figures

DESCRIPTION

Figure 1A:
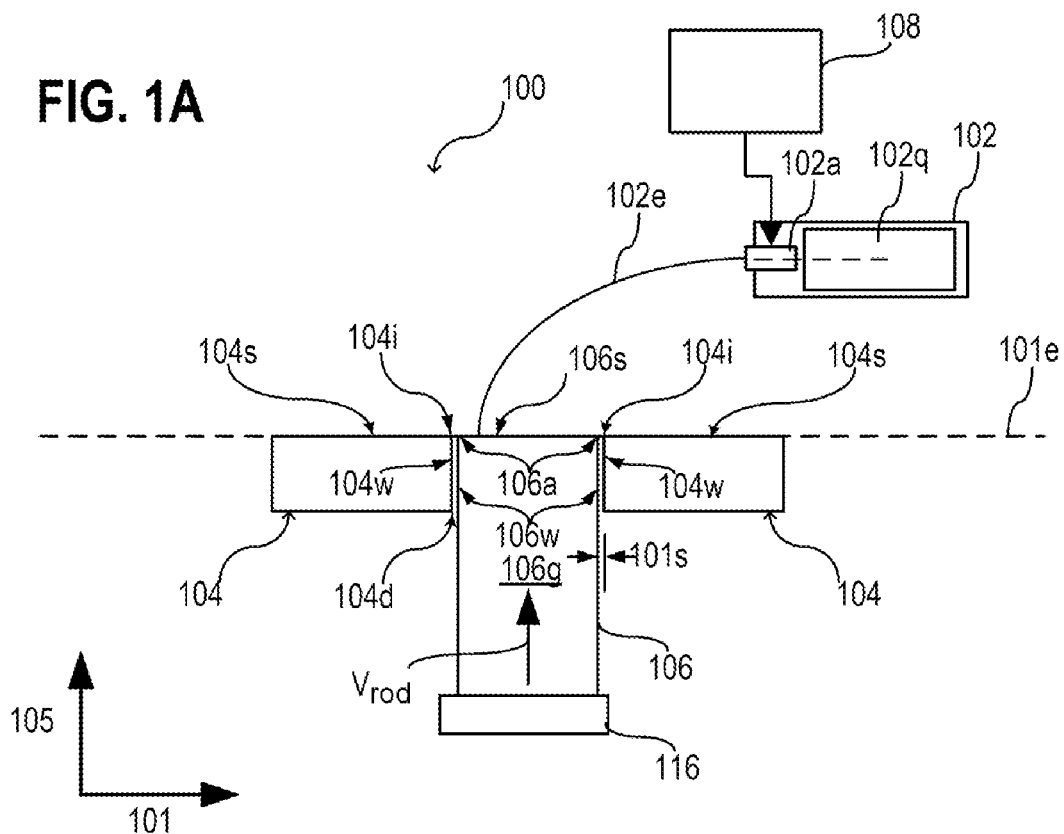
FIG. 1A shows an electron beam vaporizer in a schematic view, according to various embodiments.

In the following detailed description, reference is made to the appended drawings, which form a part thereof and in which specific embodiments are shown for illustration, in which the invention may be executed. In this regard, direction terminology such as "top", "bottom", "front", "rear", "forward", "back", etc. is used with reference to the orientation of the described figure(s). Since components of embodiments may be positioned in a number of different orientations, the direction terminology is used for illustration and is in no way restrictive. It is apparent that other embodiments may be used and structural or logical changes may be performed without deviating from the scope of protection of the present invention. It is apparent that the features of the various exemplary embodiments described herein may be combined with one another if not specifically indicated otherwise. The following detailed description is therefore not to be interpreted in a restrictive meaning, and the scope of protection of the present invention is defined by the appended claims.

In the scope of this description, the terms "connected", "attached", and "coupled" are used to describe both a direct and an indirect connection, a direct or indirect attachment, and a direct or indirect coupling. In the figures, identical or similar elements are provided with identical reference signs if this is expedient.

It may be helpful to guide and/or change a location of incidence $P(x,y,z)$ of an electron beam on a target to be vaporized along a predefined trajectory $T(P,t)$. Therefore, for example, at least one material vapor source may be generated on the target. By way of illustration, a material to be vaporized (the so-called vaporization material or target material) is transferred by means of the introduction of energy by the incident electron beam into the vapor phase (gas phase), also referred to as electron beam physical vapor deposition (EB-PVD).

An electron beam gun may have, for example, an electron beam source and a deflection device, wherein a directed electron beam may be generated by means of the electron beam source and wherein the directed electron beam may be deflected by means of the deflection device by an angle (also referred to as deflection angle).

The deflection device may be controlled in such a way that the electron beam generates a predefined pattern (for example, having a plurality of points of incidence) on the target or the desired area on which the electron beam is incident. The predefined pattern may be referred to, for example, as a deflection pattern.

In various electron beam vapor deposition methods, a ring crucible may be used. In this case, for example, the vaporization material (also referred to as target material) is fed through a passage opening of the ring crucible. The vaporization material is provided in this case in the form of a rod, which is vaporized proceeding from the top by way of illustration and may be infed from the bottom in accordance with the material removal. According to various embodiments, deflection patterns different from one another may be used during a vaporization process, in which a ring crucible is used. According to various embodiments, a first deflection pattern may be used in this case to generate the corresponding vapor source, i.e., by way of illustration, to vaporize the vaporization material or to generate the vapor source on the vaporization material. Further, according to various embodiments, a second deflection pattern may be used, for example, to remove interfering vaporization material residues, which arise on the inner edge of the crucible and/or on the outer edge of the rod and are pushed upward because of the infeed and thus also extend upward away from the crucible.

According to various embodiments, an electron beam vaporizer may include the following: an electron beam device (also referred to as an electron beam gun) for vaporizing a vaporization material, the electron beam device including: an electron beam source for generating an electron beam and a deflection device for deflecting the electron beam. Further, the electron beam vaporizer may include a ring crucible having a passage opening and a rod which is arranged in the passage opening and includes the vaporization material. In this case, an outer edge of the rod may adjoin an inner edge of the ring crucible. Further, the electron beam vaporizer may include a control device for controlling the deflection of the electron beam by means of the deflection device, wherein the control device is configured in such a way that a first deflection pattern and a second deflection pattern are alternately generated by means of the electron beam, wherein the first deflection pattern has a lower power density than the second deflection pattern, wherein the first deflection pattern is generated at least on the rod and wherein the second deflection pattern is generated on a portion of the outer edge of the rod and on a portion of the inner edge of the ring crucible.

According to various embodiments, a method for vaporizing a vaporization material, which is arranged in the form of a rod in a passage opening of a ring crucible, wherein an outer edge of the rod adjoins an inner edge of the ring crucible, may include the following: alternating generating of a first deflection pattern and a second deflection pattern by means of deflection of the electron beam, wherein the first deflection pattern has a lower power density than the second deflection pattern, wherein the first deflection pattern is generated at least on the rod, and wherein the second deflection pattern is generated on a portion of the outer edge of the rod and on a portion of the inner edge of the ring crucible.

Various embodiments relate to the coating of one or multiple substrates or other components in vacuum by means of electron beam vapor deposition. In this case, for example, a vaporization of material from a (for example, water-cooled) ring crucible with infeed of rod-shaped ingots (also referred to as vaporization material or targets) may take place. This method of the electron beam vaporization is used, for example, in the vaporization of metals or oxides to apply a high temperature corrosion protection layer or thermal insulation layer.

Conventionally, in the vaporization from a water-cooled ring crucible with rod infeed from the bottom, the electron beam power is distributed over the so-called crucible harbor (in which the vaporization material is accommodated) and the crucible edge in accordance with scanning patterns (also referred to as deflection patterns). In this case, for example, a scanning pattern may be used which has a higher power density at the inner crucible edge than in the crucible harbor and/or power may also be introduced into the crucible by means of an electron beam only at the crucible edge. Further, the exposed end face of a ring crucible may be cleaned by means of a corresponding scanning pattern. The crucible edge may thus, for example, be kept free of contaminants (for example, due to spatters of vaporization material transferred to the crucible edge). This is conventionally performed by means of a manual operator interaction as needed.

Various embodiments are based, for example, on the finding that, for example, as a result of an infeed of the vaporization material as a rod in conjunction with the contact of the outer boundary surface of the rod with the water-cooled crucible, solid vaporization material columns may remain stuck in the peripheral region between the crucible and the rod. These solid vaporization material columns may be pushed upward, for example, in the course of the infeed (for example, beyond the bath level of the liquid vaporization material) and as a consequence negatively influence the process. For example, the electron beam and vapor propagation may be obstructed because of a shading effect. Further, such vaporization material columns may tip over in the further course of the process and result in spatters.

Further, for example, it has been recognized that a general increase of the power density at the boundary between the crucible harbor and the crucible edge results in an increased power consumption, since power is increasingly transferred to the water-cooled crucible edge instead of vaporizing the vaporization material. Further, this would result in increased wear on the crucible.

Further, it has been recognized that the vaporization process should not be sporadically interrupted, for example, to clean the region at the boundary between the crucible harbor and the crucible edge. Such manual interventions increase, for example, the probability of error and the probability of crucible damage.

According to various embodiments, a method (which has long-term stability by way of illustration) and a correspondingly configured device (an electron beam vaporizer) for electron beam vaporization are provided, which enable an infeed of the vaporization material through a cooled ring crucible while avoiding the formation of interfering solid vaporization material residues above the bath level. The bath level may be defined, for example, by the surface of the molten vaporization material.

FIG. 1A illustrates an electron beam vaporizer 100 in a schematic view, according to various embodiments. The electron beam vaporizer 100 may include, for example, an electron beam device 102 for vaporizing a vaporization material 106g. The electron beam device 102 may also be referred to as an electron beam gun 102.

The electron beam device 102 may include, for example, an electron beam source 102q for generating an electron beam 102e. Further, the electron beam device 102 may include a deflection device 102a for deflecting the electron beam 102e generated by means of the electron beam source 102q.

Further, the electron beam vaporizer 100 may include a ring crucible 104 having a passage opening 104d. The passage opening 104d may extend through the ring crucible, for example, proceeding from an end face 104s of the ring crucible 104 which is exposed on top. The passage opening 104d of the ring crucible 104 may also be referred to as a crucible harbor.

Further, the electron beam vaporizer 100 may include a rod 106. The rod 106 includes, for example, the respective vaporization material 106g or consists of the respective vaporization material 106g. By way of illustration, a rod-shaped ingot 106 or a rod-shaped target made of the material which is to be vaporized may be used. The rod 106 may be arranged at least in portions in the passage opening 104d. In this case, for example, an outer edge 106a of the rod 106 adjoins an inner edge 104i of the ring crucible 104.

The electron beam 102e generated by means of the electron beam device 102 may be emitted, for example, in the direction of the ring crucible. Further, for example, a magnetic field may be used to deflect the electron beam 102e accordingly. The electron beam 102e generates a power introduction in a locally bounded region upon incidence on a solid body, wherein the region is also referred to as an electron beam spot. The size of the electron beam spot may be dependent, for example, on the focusing of the electron beam 102e and, for example, on the power of the electron beam 102e. For example, the electron beam spot may have a width or a diameter of approximately one centimeter. By means of a plurality of these electron beam spots, the desired deflection pattern may be generated on the corresponding irradiated surface.

Figure 1B:
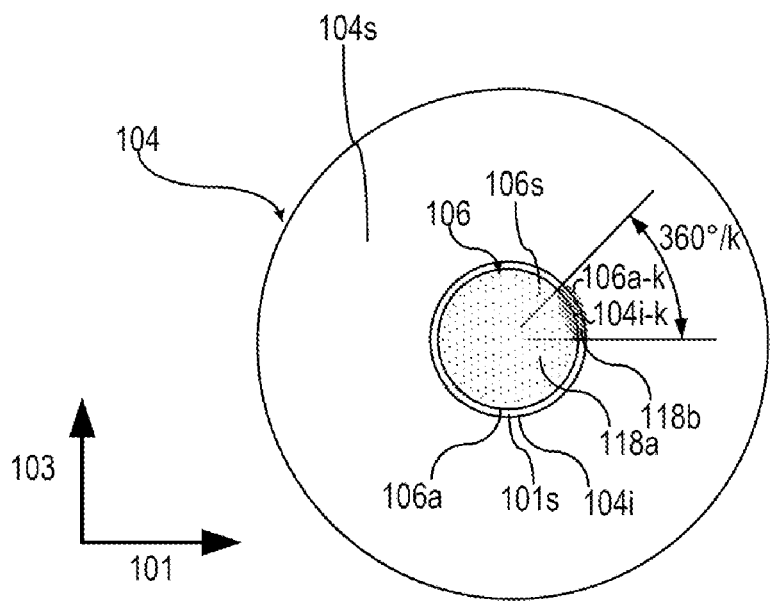
FIG. 1B shows a schematic view of two deflection patterns, which are generated on a ring crucible and a rod-shaped vaporization material by means of an electron beam, according to various embodiments.

FIG. 1B illustrates a top view of the ring crucible 104 of the electron beam vaporizer 100 having a rod 106 accommodated in the passage opening 104d, according to various embodiments.

The electron beam 102e may be deflected accordingly by means of a control device 108, which controls the deflection device 102a. According to various embodiments, the control device 108 may be configured in such a way that a first deflection pattern 118a and a second deflection pattern 118b are generated by means of the electron beam 102e.

In this case, for example, firstly the first deflection pattern 118a may be generated. The duration, $t_{scan}$, which is required, for example, to generate the first deflection pattern 118a, may be less than one second, for example, less than 100 ms, for example, in a range of approximately 1 ms to approximately 100 ms. According to various embodiments, the first deflection pattern 118a may be generated at least on the rod 106. The first deflection pattern 118a is used in this case, for example, essentially only for vaporizing the vaporization material 106g.

Further, for example, after the generation of the first deflection pattern 118a, the second deflection pattern 118 may be generated. By way of illustration, the two deflection patterns 118a, 118b may be generated alternately (in turns). The duration $t_{scan}$, which is required, for example, to generate the second deflection pattern 118b, may be less than one second, for example, less than 100 ms, for example, in a range of approximately 1 ms to approximately 100 ms. According to various embodiments, the second deflection pattern 118b may be generated on a portion 106a-k of the outer edge 106a of the rod 106 and on a portion 104i-k of the inner edge 104i of the ring crucible 104. The second deflection pattern 118b is used in this case, for example, essentially for removing vaporization material residues in the region in which the vaporization material adjoins the ring crucible 104.

According to various embodiments, the first deflection pattern 118a may have a lower power density than the second deflection pattern 118b. In this case, the proportion of time in which the second deflection pattern 118b is generated may be less overall than the time proportion in which the first deflection pattern 118a is generated.

As illustrated, for example, in FIG. 1A, the inner edge 104i of the ring crucible 104 may extend along an intersection line between an exposed ring end face 104s of the ring crucible 104 and an inner wall 104w of the ring crucible 104. Further, the outer edge 106a of the rod 106 may extend along an intersection line between an exposed end face 106s of the rod 106 and an outer wall 106w of the rod 106. The ring end face 104s of the ring crucible 104 and the exposed end face 106s (for example, oriented upward) of the rod 106 may be essentially aligned. For example, the ring end face 104s of the ring crucible 104 and the exposed end face 106s of the rod 106 may be located in a common plane 101e. The common plane 101e may also be referred to as the bath level.

According to various embodiments, the rod 106 having the vaporization material 106g may be designed matching with the passage opening 104d of the ring crucible 104. In other words, for example, the inner wall 104w of the ring crucible 104 and the outer wall 106w of the rod 106 may have essentially the same shape.

According to various embodiments, a gap 101s between the inner wall 104w of the ring crucible 104 and the outer wall 106w of the rod 106 may have a gap width of less than one centimeter, for example, less than 2 mm or less than 1 mm. The gap 101s and/or the inner wall 104w of the ring crucible 104 and the outer wall 106w of the rod 106 may define, for example, a peripheral region. The peripheral region may extend, for example, (for example, one or more centimeters) radially in the direction of the ring end face 104s of the ring crucible 104 and (for example, one or more centimeters) in the direction of the exposed end face 106s of the rod 106. In the peripheral region, for example, columnar vaporization material residues may arise, which extend beyond the plane 101e. These columnar vaporization material residues may be removed or avoided, for example, by means of the second deflection pattern 118b.

As illustrated, for example, in FIG. 1A, a thrust device 116 may be used for the infeed of the vaporization material 106g. The thrust device 116 may be configured, for example, in such a way that the rod 106 may be pushed by means of the thrust device 116 at a predefined speed, $V_{rod}$, through the passage opening 104d of the ring crucible 104 and/or into the passage opening 104d of the ring crucible 104. The predefined speed, $V_{rod}$, may be correlated, for example, with the vaporization rate, and may be, for example, in a range of approximately 0.1 millimeters per minute to approximately 10 millimeters per minute.

Figure 2A:
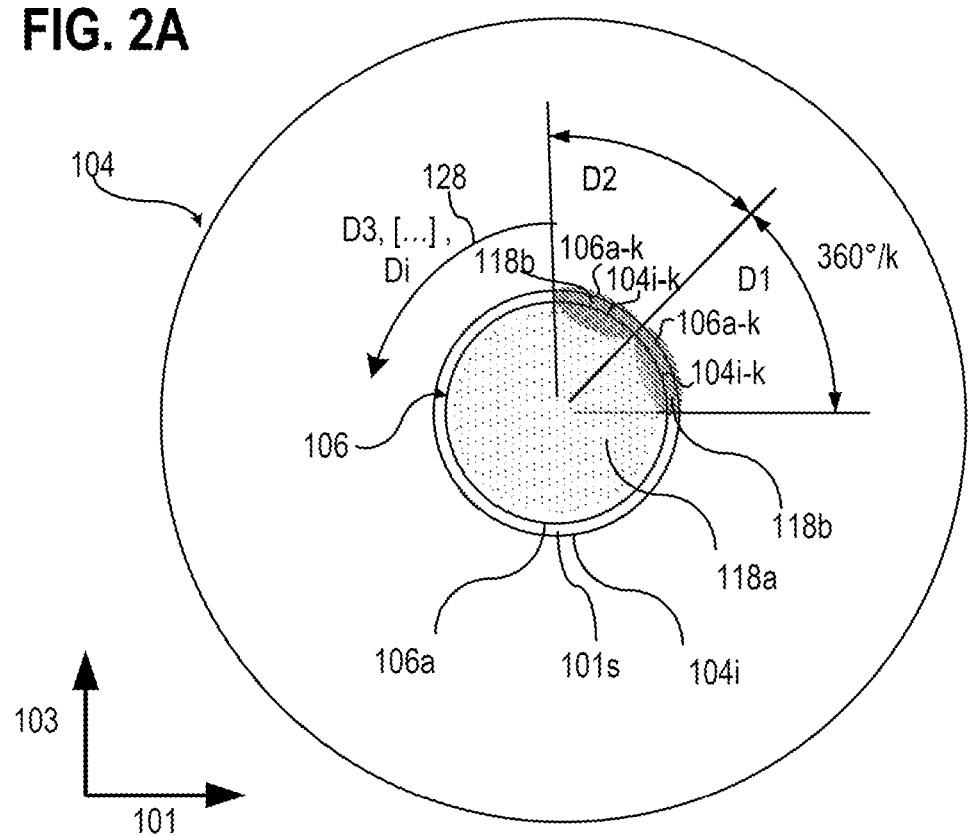
FIG. 2A shows a schematic view of two deflection patterns which are generated during two passes on a ring crucible and a rod-shaped vaporization material by means of an electron beam, according to various embodiments.

As illustrated in FIG. 2A in a schematic view, by means of the second deflection pattern 118b, in each case the entire peripheral region may be irradiated and thus sufficiently heated to remove the vaporization material residues sequentially, for example, in at least k steps. The number, k, of the individually generated second deflection patterns 118b on the peripheral region may be, for example, four or more than four. At k=4, for example, at least one-fourth (90°) of the peripheral region may be irradiated using the respective second deflection pattern 118b in each case; at k=8, for example, at least one-eighth (45°) of the peripheral region may be irradiated using the respective second deflection pattern 118b in each case; etc.

By way of illustration, the entire peripheral region is only completely irradiated once by means of the multiple second deflection patterns 118 after multiple passes, D1 to Di. One pass may include, for example, a single or multiple formation of the first deflection pattern 118a and subsequently a single or multiple formation of the second deflection pattern 118b. During successive passes, for example, only the position of the second deflection pattern 118b may be changed, for example, the second deflection pattern 118b may be displaced along the peripheral region (for example, along a curved path 128 or a closed circumferential path).

Figure 2B:
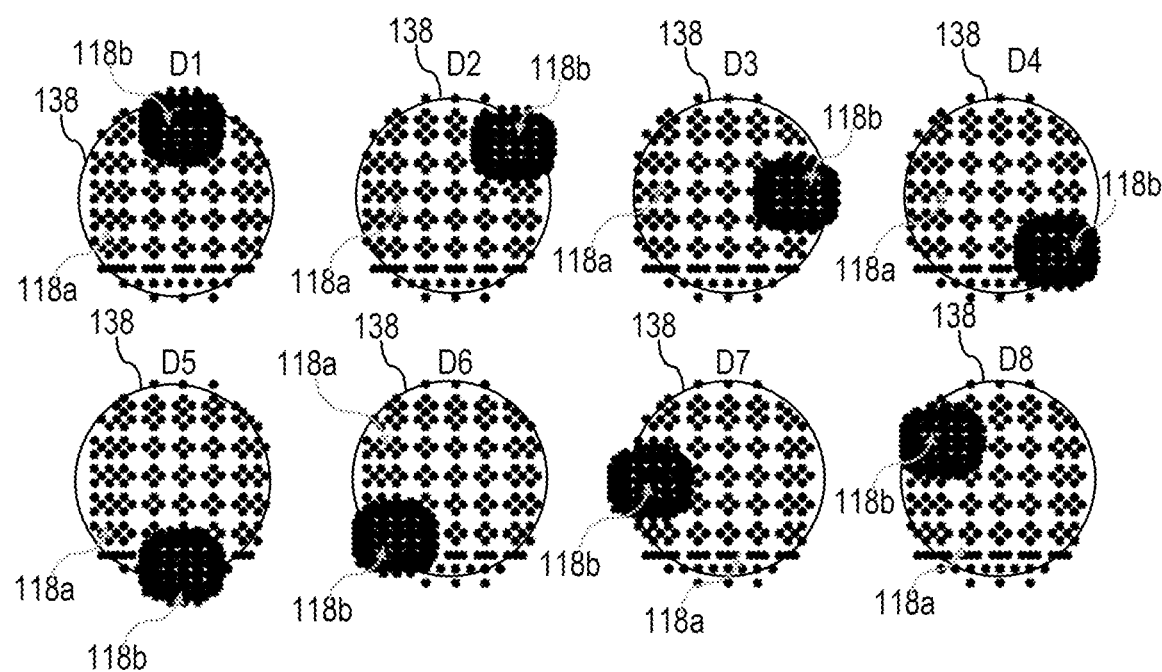
FIG. 2B shows a schematic view of multiple deflection patterns, which are generated during multiple passes on a ring crucible and a rod-shaped vaporization material by means of an electron beam, according to various embodiments.

FIG. 2B illustrates the respective deflection patterns 118a, 118b at various points in time and/or during various successive passes D1 to D8. In this case, the peripheral region 138 (for example, including the gap 101s and the inner edge 104i of the ring crucible 104 and the outer edge 106a of the rod 106) is illustrated as a line. The electron beam spots 138 are shown as individual dots, which in total form the respective deflection pattern 118a, 118b.

According to various embodiments, the control device 108 may be configured in such a way that the second deflection pattern 118b is generated at least once on the entire peripheral region 138 (by way of illustration on each portion 106a-k of the outer edge 106a of the rod 106 and on each portion 104i-k of the inner edge 104i of the ring crucible 104) within a predefined duration, $t_{revolution}$. In FIG. 2B, eight passes D1 to D8 are used to cover the entire peripheral region 138 by means of the second deflection pattern 118b.

The predefined duration, $t_{revolution}$, may be, for example, in a range of approximately 0.1 minutes to approximately 60 minutes, for example, in a range of approximately 0.5 minutes to approximately 5 minutes. Further, the predefined duration, $t_{revolution}$, may be in a range of approximately 0.1 mm/$V_{rod}$ to approximately 50 mm/$V_{rod}$, e.g., in a range of approximately 1 mm/$V_{rod}$ to approximately 5 mm/$V_{rod}$.

For example, it is thus possible to prevent columnar vaporization material residues from being able to protrude upward by more than 1 mm to 5 mm.

Figure 3:
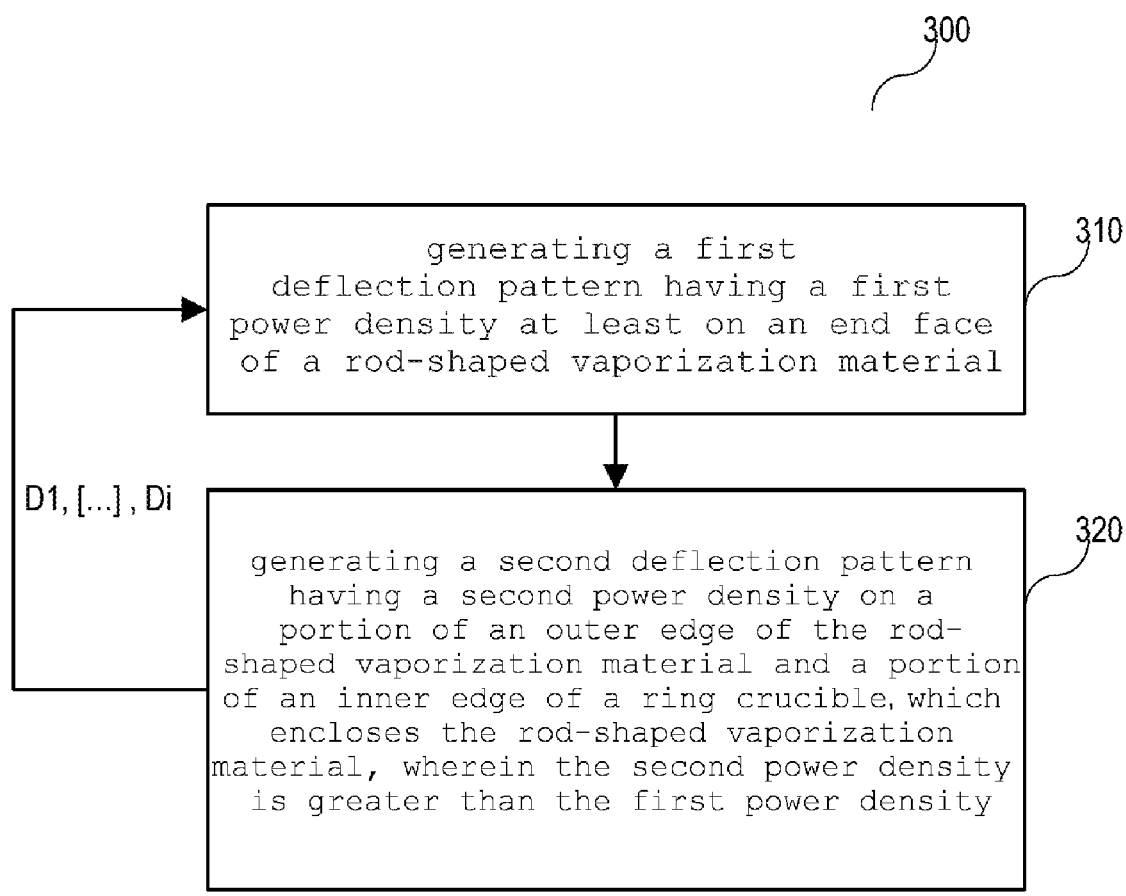
FIG. 3 shows a schematic flow chart of a method for vaporizing a vaporization material by means of an electron beam, according to various embodiments.

FIG. 3 shows a schematic flow chart of a method 300 for vaporizing a vaporization material 106g by means of an electron beam 102e, wherein the vaporization material 106g is arranged in the form of a rod 106 in a passage opening 104d of a ring crucible 104, wherein an outer edge 106a of the rod 106 adjoins an inner edge 104i of the ring crucible 104.

According to various embodiments, the method 300 may include: in 310, generating a first deflection pattern 118a having a first power density at least on an end face 106s of a rod-shaped vaporization material 106; and, in 320, generating a second deflection pattern 118b having a second power density on a portion 106a-k of an outer edge 106a of the rod-shaped vaporization material 106 and a portion 104i-k of an inner edge 104i of a ring crucible 104, which encloses the rod-shaped vaporization material 106, wherein the second power density is greater than the first power density. To generate the second deflection pattern 118b on the entire outer edge 106a of the rod-shaped vaporization material 106 and the entire inner edge 104i of the ring crucible 104, the steps 310, 320 of the method may be repeated, for example, in Di passes.

According to various embodiments, the method 300 may include: alternately generating a first deflection pattern 118a and a second deflection pattern 118b by means of deflection of the electron beam 102e, wherein the first deflection pattern 118a has a lower power density than the second deflection pattern 118b, wherein the first deflection pattern 118a is generated at least on the rod 106, and wherein the second deflection pattern 118a is generated on a portion 106a-k of the outer edge 106a of the rod 106 and on a portion 104i-k of the inner edge 104i of the ring crucible 104.

As described above, an overall scanning pattern may be generated by means of superposition of a predominantly fixed first partial scanning pattern and a second partial scanning pattern which is shifted in chronological sequence. The first partial scanning pattern is referred to herein as the first deflection pattern 118a and the second partial scanning pattern is referred to herein as the second deflection pattern 118b.

According to various embodiments, the first deflection pattern 118a may have an essentially rotationally-symmetrical power distribution. For example, the power of the electron beam 102e may be introduced by means of the first deflection pattern 118a essentially into the crucible harbor, i.e., into the region of the ring crucible 104 in which the rod-shaped vaporization material 106 may be accommodated.

In this case, the first deflection pattern 118a may be provided in such a way that the power density is equally distributed, for example, over the entire crucible harbor 104d. Alternatively thereto, the first deflection pattern 118a may be provided in such a way that the power density distribution is dependent on the distance from the crucible center; for example, the power density at the crucible edge (for example, in the vicinity of the outer edge 106a of the rod 106) may be higher than the power density in the crucible center or in the rod center.

The second deflection pattern 118b may be or become provided, for example, using an elliptical shape. Further, the second deflection pattern may be provided having a planar extension in the order of magnitude of approximately 1% to approximately 25% of the area of the crucible harbor 104d.

The second deflection pattern 118b may, for example, be active during 10% to 50% of the total irradiation time.

According to various embodiments, the method described herein may be used for the vapor deposition of turbine blades with ceramic thermal barrier layers. For example, yttrium-stabilized zirconium oxide may be used as the vaporization material.

Various directions 101, 103, 105 are illustrated by way of example in the figures. The three directions 101, 103, 105 may each be perpendicular to one another and thus form a Cartesian coordinate system by way of illustration. The direction 101 may illustrate a vertical direction.

Various examples are described hereafter, which refer to the aforementioned described above and illustrated in the figures.

Example 1 is an electron beam vaporizer 100 for vaporizing a vaporization material, the electron beam vaporizer 100 including: an electron beam device 102 having an electron beam source 102q for generating an electron beam 102e and a deflection device 102a for deflecting the electron beam 102e; a ring crucible 104 having a passage opening 104d, a rod 106, which is arranged at least in portions in the passage opening 104d and includes the vaporization material 106g, wherein an outer edge 106a of the rod 106 adjoins an inner edge 104i of the ring crucible 104; a control device 108 for controlling the deflection of the electron beam by means of the deflection device 102a, wherein the control device 108 is configured in such a way that a first deflection pattern 118a and a second deflection pattern 118b are alternately generated by means of the electron beam 102e, wherein the first deflection pattern 118a has a lower power density than the second deflection pattern 118b, wherein the first deflection pattern 118a is generated at least on the rod 106 and wherein the second deflection pattern 118b is generated on a portion 106a-k of the outer edge 106a of the rod 106 and on a portion 104i-k of the inner edge 104i of the ring crucible 104.

In other words, an electron beam vaporizer 100 may include the following: an electron beam source 102q for generating an electron beam 102e; a deflection device 102a for deflecting the electron beam 102e; a ring crucible 104 having a passage opening 104d, a rod 106, which is arranged at least in portions in the passage opening 104d and includes the vaporization material 106g, wherein an outer edge 106a of the rod 106 adjoins an inner edge 104i of the ring crucible 104; a control device 108 for controlling the deflection of the electron beam by means of the deflection device 102a, wherein the control device 108 is configured in such a way that a first deflection pattern 118a and a second deflection pattern 118b are alternately generated by means of the electron beam 102e, wherein the first deflection pattern 118a has a lower power density than the second deflection pattern 118b, wherein the first deflection pattern 118a is generated at least on the rod 106 and wherein the second deflection pattern 118b is generated on a portion 106a-k of the outer edge 106a of the rod 106 and on a portion 104i-k of the inner edge 104i of the ring crucible 104.

In example 2, the electron beam vaporizer 100 according to example 1 may further include that the inner edge 104i of the ring crucible 104 extends along an intersection line between an exposed ring end face 104s of the ring crucible 104 and an inner wall 104w of the ring crucible 104.

In example 3, the electron beam vaporizer 100 according to example 1 or 2 may further include that the outer edge 106a of the rod 106 extends along an intersection line between an exposed end face 106s of the rod 106 and an outer wall 106w of the rod 106.

In example 4, the electron beam vaporizer 100 according to examples 3 and 4 may further include that the inner wall 104w of the ring crucible 104 and the outer wall 106w of the rod 106 have essentially the same shape.

In example 5, the electron beam vaporizer 100 according to example 4 may further include that a gap 101s between the inner wall 104w of the ring crucible 104 and the outer wall 106w of the rod 106 has a gap width of less than 1 cm.

In example 6, the electron beam vaporizer 100 according to any one of examples 1 to 5 may further include: a thrust device 116, which is configured in such a way that the rod 106 may be or is pushed by means of the thrust device 116 at a predefined speed, $V_{rod}$, into the passage opening 104d of the ring crucible 104.

In example 7, the electron beam vaporizer 100 according to example 6 may further include that the predefined speed, $V_{rod}$, is in a range of approximately 0.1 millimeters per minute to approximately 10 millimeters per minute.

In example 8, the electron beam vaporizer 100 according any one of examples 1 to 7 may further include that the control device 108 is configured in such a way that the second deflection pattern 118b is generated at least once within a predefined duration, $t_{revolution}$, on each portion 106a-k of the outer edge 106a of the rod 106 and on each portion 104i-k of the inner edge 104i of the ring crucible 104.

In example 9, the electron beam vaporizer 100 according to example 8 may further include that the predefined duration, $t_{revolution}$, is in a range of approximately 0.5 minutes to approximately 300 minutes, e.g., in a range of approximately 5 minutes to approximately 30 minutes.

In example 10, the electron beam vaporizer 100 according to example 8 may further include that the predefined duration, $t_{revolution}$, is in a range of approximately 1 mm/$V_{rod}$ to approximately 50 mm/$V_{rod}$, for example, in a range of approximately 5 mm/$V_{rod}$ to approximately 30 mm/$V_{rod}$.

In example 11, the electron beam vaporizer 100 according to any one of examples 1 to 10 may further include that the second deflection pattern 118b includes at least one electron beam spot 118s which is located both on the portion 106a-k of the outer edge 106a of the rod 106 and also on the portion 104i-k of the inner edge 104i of the ring crucible 104.

In example 12, the electron beam vaporizer 100 according to example 11 may further include that the electron beam spot 118s has a width (by way of illustration a maximum width measured on the area on which the electron beam is incident) or a diameter (by way of illustration, measured on the area on which the electron beam is incident) in a range of approximately 0.5 cm to approximately 2 cm.

In example 13, the electron beam vaporizer 100 according to any one of examples 1 to 12 may further include that the portion 106a-k of the outer edge 106a of the rod 106 includes a proportion of less than 25% of the overall outer edge 106a, and wherein the portion 104i-k of the inner edge 104i of the ring crucible 104 includes a proportion of less than 25% of the overall inner edge 104i.

In example 14, the electron beam vaporizer 100 according to any one of examples 1 to 13 may further include that the control device 108 is configured in such a way that the first deflection pattern 118a is formed n times in succession, and subsequently the second deflection pattern 118b is formed m times in succession, wherein n and m are each positive integers.

In example 15, the electron beam vaporizer 100 according to any one of examples 1 to 13 may further include that the control device 108 is configured in such a way that, in a first pass D1, the first deflection pattern 118a is formed at least once and subsequently the second deflection pattern 118b is formed at least once, and, in a second pass D2, the first deflection pattern 118a is formed at least once and subsequently the second deflection pattern 118b is formed at least once, wherein the second deflection pattern 118b has a different position in the second pass D2 than in the first pass D1; and wherein the first deflection pattern 118a, for example, has essentially the same position in the second pass D2 as in the first pass D1.

In example 16, the electron beam vaporizer 100 according to any one of examples 1 to 13 may further include that the control device 108 is configured in such a way that, in multiple passes D1-Di, the first deflection pattern 118a is formed at least once and subsequently the second deflection pattern 118b is formed at least once in each case per pass; wherein the second deflection pattern 118a has different positions during the multiple passes D1-Di, wherein the various positions are arranged along a closed path 128; and wherein the first deflection pattern 118a, for example, has essentially the same position during the multiple passes D1-Di.

In example 17, the electron beam vaporizer according to example 16 may further include that the multiple passes D1-Di take place within a predefined duration, $t_{revolution}$. For example, within a predefined duration, $t_{revolution}$, according to example 9 or 10.

In example 18, the electron beam vaporizer 100 according to any one of examples 14 to 17 may further include that the formation of the respective individual first and second deflection pattern 118a, 118b takes place within a predefined duration, $t_{scan}$, of less than 100 milliseconds.

In example 19, the electron beam vaporizer 100 according to any one of examples 1 to 18 may further include that the vaporization material 106g is a ceramic material. The ceramic material may be, for example, an oxide material, e.g., a metal oxide or semimetal oxide. The ceramic material may include, for example, zirconium oxide.

Example 20 is a method for vaporizing a vaporization material by means of an electron beam, wherein the vaporization material is arranged in the form of a rod in a passage opening of a ring crucible, wherein an outer edge of the rod adjoins an inner edge of the ring crucible, the method including: alternately generating a first deflection pattern and a second deflection pattern by means of deflection of the electron beam, wherein the first deflection pattern has a lower power density than the second deflection pattern, wherein the first deflection pattern is generated at least on the rod, and wherein the second deflection pattern is generated on a portion of the outer edge of the rod and on a portion of the inner edge of the ring crucible.

Example 21 is a method for vaporizing a vaporization material by means of an electron beam, the method including: generating a first deflection pattern 118a having a first power density at least on an end face of a rod-shaped vaporization material; and generating a second deflection pattern 118b having a second power density on a portion of an outer edge of the rod-shaped vaporization material and a portion of an inner edge of a ring crucible, which encloses the rod-shaped vaporization material, wherein the second power density is greater than the first power density.

What is claimed is:
1. An electron beam vaporizer for vaporizing a vaporization material, the electron beam vaporizer comprising:
an electron beam source for generating an electron beam;
an electron beam deflector for deflecting the electron beam;

a ring crucible having a passage opening configured to receive a rod arranged at least partially in the passage opening, and the rod comprising the vaporization material, wherein an outer edge of the rod is adjacent to an inner edge of the ring crucible such that there is a gap between the inner edge of the ring crucible and the outer edge of the rod; and a controller configured to control the electron beam deflector to deflect the electron beam, wherein the controller is configured to control the electron beam deflector to alternately form a first deflection pattern and a second deflection pattern from the electron beam, wherein the first deflection pattern has a lower power density than the second deflection pattern, wherein the first deflection pattern is generated at least on the rod and the second deflection pattern is generated at least on a portion of the outer edge of the rod and on a portion of the inner edge of the ring crucible.

2. The electron beam vaporizer as claimed in claim 1, wherein the inner edge of the ring crucible extends along an intersection line between an exposed ring end face of the ring crucible and an inner wall of the ring crucible; and wherein the outer edge of the rod extends along an intersection line between an exposed end face of the rod and an outer wall of the rod.

3. The electron beam vaporizer as claimed in claim 2, wherein a gap between the inner wall of the ring crucible and the outer wall of the rod has a gap width of less than 1 cm.

4. The electron beam vaporizer as claimed in claim 1, further comprising:

a rod drive configured to feed the rod at a predefined speed, $V_{rod}$, into the passage opening of the ring crucible.

5. The electron beam vaporizer as claimed in claim 4, wherein the predefined speed is in a range of approximately 0.1 millimeters per minute to approximately 10 millimeters per minute.

6. The electron beam vaporizer as claimed in claim 4, wherein the controller is configured to control the electron beam deflector to form the second deflection pattern at least once on each portion of the outer edge of the rod and on each portion of the inner edge of the ring crucible within a predefined duration.

7. The electron beam vaporizer as claimed in claim 6, wherein the predefined duration is in a range of approximately 0.1 minutes to approximately 60 minutes.

8. The electron beam vaporizer as claimed in claim 6, wherein the predefined duration is in a range of approximately 0.1 mm/$V_{rod}$ to approximately 50 mm/$V_{rod}$.

9. The electron beam vaporizer as claimed in claim 1, wherein the second deflection pattern comprises at least one electron beam spot which is located both on the portion of the outer edge of the rod and also on the portion of the inner edge of the ring crucible.

10. The electron beam vaporizer as claimed in claim 9, wherein the electron beam spot has a width or a diameter in a range of approximately 0.5 cm to approximately 2 cm.

11. The electron beam vaporizer as claimed in claim 1, wherein the portion of the outer edge of the rod comprises a proportion of less than 25% of the overall outer edge and wherein the portion of the inner edge of the ring crucible comprises a proportion of less than 25% of the overall inner edge.

12. The electron beam vaporizer as claimed in claim 1, wherein the controller is configured to control the electron beam deflector to form the first deflection pattern n times in succession, and subsequently the second deflection pattern m times in succession, where n and m are each positive integers.

13. The electron beam vaporizer as claimed in claim 1, wherein the controller is configured to control the electron beam deflector to form the first deflection pattern and the second deflection pattern in a first pass, the first deflection pattern is formed at least once and subsequently the second deflection pattern is formed at least once and a second pass, the first deflection pattern is formed at least once and subsequently the second deflection pattern is formed at least once, with the second deflection pattern being formed at a different position in the second pass than in the first pass.

14. The electron beam vaporizer as claimed in claim 1, wherein the controller is configured in such a way that, in multiple passes, each pass comprises forming the first deflection pattern at least once and subsequently forming the second deflection pattern at least once;

wherein across individual passes of the multiple passes, the second deflection pattern is formed at various positions that are arranged along a closed path.

15. The electron beam vaporizer as claimed in claim 13, wherein the formation of the respective individual first deflection pattern is performed within a predefined duration of less than 100 ms and/or wherein the formation of the respective second deflection pattern is performed within a predefined duration of less than 100 ms.

16. The electron beam vaporizer as claimed in claim 14, wherein the multiple passes take place within a predefined duration in a range of approximately 0.5 minutes to approximately 300 minutes.

17. The electron beam vaporizer as claimed in claim 14, wherein the multiple passes take place within a predefined duration in a range of approximately 1 mm/$V_{rod}$ to approximately 50 mm/$V_{rod}$.

18. The electron beam vaporizer as claimed in claim 1, wherein the vaporization material is a ceramic material.

19. An electron beam vaporizer for vaporizing a vaporization material, the electron beam vaporizer comprising:

an electron beam source for generating an electron beam;

an electron beam deflector for deflecting the electron beam;

a ring crucible having a passage opening configured to receive a rod arranged at least partially in the passage opening, and the rod comprising the vaporization material, wherein an outer edge of the rod is adjacent to an inner edge of the ring crucible such that there is a gap between the inner edge of the ring crucible and the outer edge of the rod; and a controller configured to control the electron beam deflector to deflect the electron beam, wherein the controller is configured to control the electron beam deflector to alternately provide a first irradiation pattern and a second irradiation pattern via the electron beam, wherein the first irradiation pattern has a lower power density than the second irradiation pattern, wherein the first irradiation pattern is generated at least on the rod and the second irradiation pattern is generated at least on a portion of the outer edge of the rod and on a portion of the inner edge of the ring crucible and the second irradiation pattern is configured to additionally clean the portion of the inner edge of the ring crucible.

20. An electron beam vaporizer for vaporizing a vaporization material, the electron beam vaporizer comprising:

an electron beam source for generating an electron beam;

an electron beam deflector for deflecting the electron beam;

a ring crucible having a passage opening configured to receive a rod arranged at least partially in the passage opening, and the rod comprising the vaporization material, wherein an outer edge of the rod is adjacent to an inner edge of the ring crucible such that there is a gap between the inner edge of the ring crucible and the outer edge of the rod; and a controller configured to control the electron beam deflector to deflect the electron beam to alternately irradiate:

according to a first irradiation pattern with a first power density, at least the rod, and according to a second irradiation pattern with a second power density, a region comprising at least a portion of the outer edge of the rod and a portion of the inner edge of the ring crucible;

wherein the first power density differs from the second power density.

* * * * *